United States Patent
St. John et al.

(10) Patent No.: US 8,209,650 B2
(45) Date of Patent: Jun. 26, 2012

(54) METHOD AND SYSTEM FOR ENTRY AND VERIFICATION OF PARASITIC DESIGN CONSTRAINTS FOR ANALOG INTEGRATED CIRCUITS

(75) Inventors: Ian St. John, Carrollton, TX (US); Mohamed Kamal Mahmoud, Allen, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 813 days.

(21) Appl. No.: 12/103,961

(22) Filed: Apr. 16, 2008

(65) Prior Publication Data
US 2009/0265672 A1 Oct. 22, 2009

(51) Int. Cl.
*G06F 17/50* (2006.01)
(52) U.S. Cl. ......... 716/111; 716/101; 716/118; 716/139
(58) Field of Classification Search .................. 716/101, 716/111, 118, 139
See application file for complete search history.

(56) References Cited

U.S. PATENT DOCUMENTS

| | | | |
|---|---|---|---|
| 6,578,184 B2 * | 6/2003 | Fukuda et al. | 716/129 |
| 6,591,402 B1 * | 7/2003 | Chandra et al. | 716/106 |
| 7,251,800 B2 * | 7/2007 | McElvain et al. | 716/12 |

OTHER PUBLICATIONS

Sangameswaran, et al.; "Post-Layout Parasitic Verification Methodology for Mixed-Signal Designs Using Fast-Spice Simulators"; IEEE 0-7803-9516; Jun. 2005; pp. 211-214.

* cited by examiner

*Primary Examiner* — Thuan Do
(74) *Attorney, Agent, or Firm* — Ronald O. Neerings; Wade James Brady, III; Frederick J. Telecky, Jr.

(57) ABSTRACT

A method of designing an analog integrated circuit (IC), a parasitic constraint analyzer and a method of determining a layout of an analog IC complies with parasitic constraints. In one embodiment, the method of designing an analog IC includes: (1) creating a schematic of an analog integrated circuit based on a set of specifications, (2) attaching parasitic constraints to the schematic, (3) creating a layout of the analog integrated circuit based on the schematic including the parasitic constraints, (4) extracting parasitic values from parasitic elements of the layout and (5) comparing the extracted parasitic values with the parasitic constraints to verify compliance therewith.

21 Claims, 1 Drawing Sheet

METHOD AND SYSTEM FOR ENTRY AND VERIFICATION OF PARASITIC DESIGN CONSTRAINTS FOR ANALOG INTEGRATED CIRCUITS

TECHNICAL FIELD OF THE DISCLOSURE

The disclosure is directed, in general, to designing analog integrated circuits (ICs) and, more specifically, to designing analog ICs that comply with parasitic constraints.

BACKGROUND OF THE DISCLOSURE

Typically, the design process of an analog IC begins with the development of a schematic diagram based on a set of specifications. The set of specifications includes estimated parasitic resistance, capacitance and inductance values for the components of the schematic diagram. The schematic diagram is then simulated to verify the specifications are met. Before simulation, the estimated parasitic values (or "parasitics") are typically increased to ensure that compliance remains during later stages of the design process. If the specifications are not met, the parasitic values can be adjusted and simulation performed again until satisfied.

After the schematic diagram is created and simulated, a layout diagram based on the schematic is created. Once the layout design has been completed, simulations are again required to verify that the layout diagram of the integrated circuit still meets the required specifications in the presence of parasitic values extracted from the layout. A full "back-annotation" of these parasitic values into the schematic of the circuit under test is required for simulation to verify performance. This can require, for example, adding anywhere between 1,000 and 1,000,000 parasitic components (depending on the size of the layout) into the schematic for simulation. The addition of these components can lead to simulations that may not converge (i.e., fail) or may have an extremely long run time. Since the range of parasitic element values can cause non-convergence or extended simulations for complex layouts, full parasitic extraction may not be feasible. Additionally, extracting the parasitic values and back-annotating these parasitic values does not intercept potential problems early in the design process. Instead, the layout is completed before the parasitic element values are extracted.

To ease extraction difficulties, some design processes may use a selected nets extraction with complex layouts. However, using selected nets extraction requires a separate extraction for each newly constrained net. Additionally, using selected nets extraction relies on the nodes in the layout that are known. As such, there is not a mechanism to specify global constraints for a circuit. Furthermore, parasitic values may be over-reported in certain situation. Accordingly, what is needed in the art is an improved method or system to ensure parasitic constraints for analog ICs are satisfied during the design process.

SUMMARY OF THE DISCLOSURE

To address the above-discussed deficiencies of the prior art, one aspect of the disclosure provides a method of designing an analog IC. In one embodiment, the method includes: (1) creating a schematic of an analog integrated circuit based on a set of specifications, (2) attaching parasitic constraints to the schematic, (3) creating a layout of the analog integrated circuit based on the schematic including the parasitic constraints, (4) extracting parasitic values from parasitic elements of the layout and (5) comparing the extracted parasitic values with the parasitic constraints to verify compliance therewith.

In another aspect, the disclosure provides a parasitic constraint analyzer. In one embodiment, the parasitic constraint analyzer includes: (1) a constraint manager configured to associate parasitic constraints to components of a schematic of an analog integrated circuit and (2) a constraint confirmer coupled to the constraint manager and configured to compare parasitic values extracted from a layout of the schematic with the parasitic constraints to determine if the layout complies therewith.

In yet another aspect, the disclosure provides a method of determining a layout of an analog IC complies with parasitic constraints. In one embodiment, this method includes: (1) receiving parasitic constraints for an analog integrated circuit, (2) attaching the parasitic constraints to a schematic of the analog integrated circuit, (3) comparing parasitic values extracted from a layout of the schematic with the parasitic constraints to verify compliance therewith and (4) determining if one of the parasitic constraints is unreasonable.

BRIEF DESCRIPTION OF THE DRAWINGS

For a more complete understanding of the disclosure, reference is now made to the following descriptions taken in conjunction with the accompanying drawings, in which.

DETAILED DESCRIPTION

The disclosure provides an apparatus and method to check design constraints on parasitic values for analog ICs and therefore avoid lengthy simulations that may result in verifying the impact of the parasitics on the circuits. The apparatus and method allow a schematic designer to enter a variety of parasitic constraints and attach these constraints to a schematic diagram of the analog ICs. The parasitic constraints that may be entered and attached can specify, for example, the maximum allowed: resistance between two nodes, capacitance between two nodes, total capacitance on a node, total capacitance on any node, RC time constant between two nodes, or capacitance mismatch between two nodes. These varied parasitic constraints allow the schematic designer to anticipate the parasitic effects on the analog ICs and simulate using these expected values before constructing layout diagrams of the analog ICs.

Since the constraints are attached to the schematic view, the schematic designer can forward the parasitic constraints to the layout engineer. The layout engineer can then use the attached constraints to ensure that parasitic values resulting from the creation of the layout are less than the specified values from the specifications for an analog IC. Conventional parasitic probing functions may be used automatically to parse the parasitic values present in an extracted view of the layout. The extracted values can then be compared to the parasitic constraints for verification that each of the constraints is satisfied in the layout.

An example of such a probing function is Assura® Parasitic Extraction (RCX) which provides high-speed parasitic extraction on full-chip layouts and is a fully-integrated part of the silicon analysis function inside the Virtuoso® custom design platform. Both Assura® RCX and Virtuoso® custom design platform are parts of the Cadence Design Framework II (DFII) which also includes: a library and tools for design management (Library Manager), schematic entry (Virtuoso® Schematics), physical layout (Virtuoso® Layout), verification (Assura®), and simulation (Spectre). DFII is distributed by Cadence Design Systems, Inc., of San Jose, Calif. (Cadence). As discussed herein, the disclosure can interface with the DFII during the design flow of an analog IC.

If the parasitic constraints are not met, the disclosure will allow the schematic designer to see the value of the parasitic elements (both individual and total values) and the location of these parasitic elements in the extracted view. The schematic designer can also add error markers to the schematic view denoting a constraint violation. Thus, through the tools and methodology of this disclosure, the schematic designer can simulate an analog IC using the values of the parasitic constraints instead of the large number of parasitic components present in the layout/extracted view. This can result in drastically improved simulation times and prevent re-simulation to verify compliance.

Figure 1:
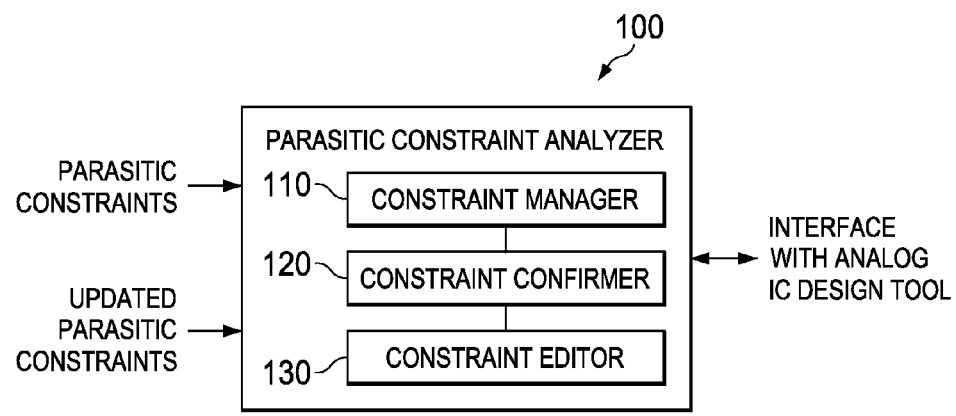
FIG. 1 is a block diagram of an embodiment of a parasitic constraint analyzer constructed according to the principals of the present disclosure.

FIG. 1 illustrates a block diagram of an embodiment of a parasitic constraint analyzer 100 constructed according to the principals of the present disclosure. The parasitic constraint analyzer 100 may be used with conventional integrated circuit design and test tools, such as, tools from the DFII from Cadence. The parasitic constraint analyzer 100 may be implemented on a general purpose computing device, having a readable-memory, which is directed by a sequence of operating instructions. The operating instructions may be coded using a programming language such as SKILL® from Cadence. The parasitic constraint analyzer 100 may be embodied as a dedicated device constructed of special-purpose hardware. In one embodiment, the parasitic constraint analyzer 100 may be implemented using a programmable logic array. The parasitic constraint analyzer 100 includes a constraint manager 110, a constraint confirmer 120 and a constraint editor 130.

The constraint manager 110 is configured to associate parasitic constraints to components of a schematic diagram of an analog IC. The parasitic constraints may be derived from the set of specifications in which the schematic diagram is developed. The constraint manager 110 may receive the parasitic constraints via manual entry by a user. For example, the constraint manager 110 can provide an input form on a computer display that allows a user to identify a node in the schematic (e.g., via a probe button) and enter a parasitic constraint (e.g., via the keyboard) for the identified node. The constraint manager 110 can then attach the received parasitic constraint to the identified node of the schematic.

Additionally, the constraint manager 110 can specify the parasitic constraints for a cellview selected from a library of an IC design tool such as a Cadence DFII library. Thus, the parasitic constraints may be attached to the schematic when the cellview is selected for generating the schematic. The constraint manager 110 may also receive the parasitic constraints from a data file based on the set of specifications for the analog IC and attach the parasitic constraints to the corresponding nodes in the schematic as identified by the data file.

The parasitic constraints may include, for example, capacitance, resistance or RC time constant constraints associated with nodes of the schematic diagram of the analog IC. The resistance constraint may be between two nodes. The capacitance constraint may be between two nodes, total capacitance on a node, total capacitance on any node or capacitance mismatch between two nodes. The RC time constant constraint may be between two nodes. The parasitic constraint may be a global constraint for the analog IC. For example, the parasitic constraint may include that no node of the analog IC have a capacitance greater than a designated value.

The constraint confirmer 120, coupled to the constraint manager 110, is configured to verify parasitic values of a layout diagram comply with the parasitic constraints. Additionally, the constraint confirmer 120 is configured to identify those parasitic constraints that are violated. Verification of compliance with the constraints may be performed by comparing the parasitic values from an extracted view of the layout against the parasitic constraints. The parasitic values may be extracted using a conventional tool having a probing function such as Assura® RCX. The parasitic values are extracted from a database that is populated with extracted data from the layout. Repeated probing requests extract the values that are then compared to the parasitic constraints from the schematic to determine compliance. Thus, unlike conventional systems that re-simulate using the extracted parasitic values from a layout to verify compliance, the constraint confirmer 120 can verify compliance with the parasitic constraints without back-annotation of the parasitic values and then simulating.

The constraint editor 130 is configured to adjust the parasitic constraints. Typically, the constraint editor 130 determines if a parasitic constraint is unreasonable and allows adjustment of the parasitic constraint if it is unreasonable. In some embodiments, the constraint editor 130 may not determine if a parasitic constraint is unreasonable unless it is violated. The constraint editor 130 may automatically determine if the parasitic constraint is unreasonable through a series of logical checks. For example, the constraint editor 130 may compare the parasitic constraint to zero (0) to confirm a valid parasitic constraint has been entered. Additionally, the constraint editor 130 may analyze a parasitic constraint and determine the constraint is impossible. For example, the parasitic constraint may be that the resistance between two nodes in an analog IC is one (1) ohm. The constraint editor 130 may determine that such a resistance between those two nodes is not possible. As such, the constraint editor 130 can receive an updated parasitic constraint via user input (e.g., an input form). Alternatively, the constraint editor 130 may automatically determine the parasitic constraint for based on, e.g., known extracted values.

Figure 2:
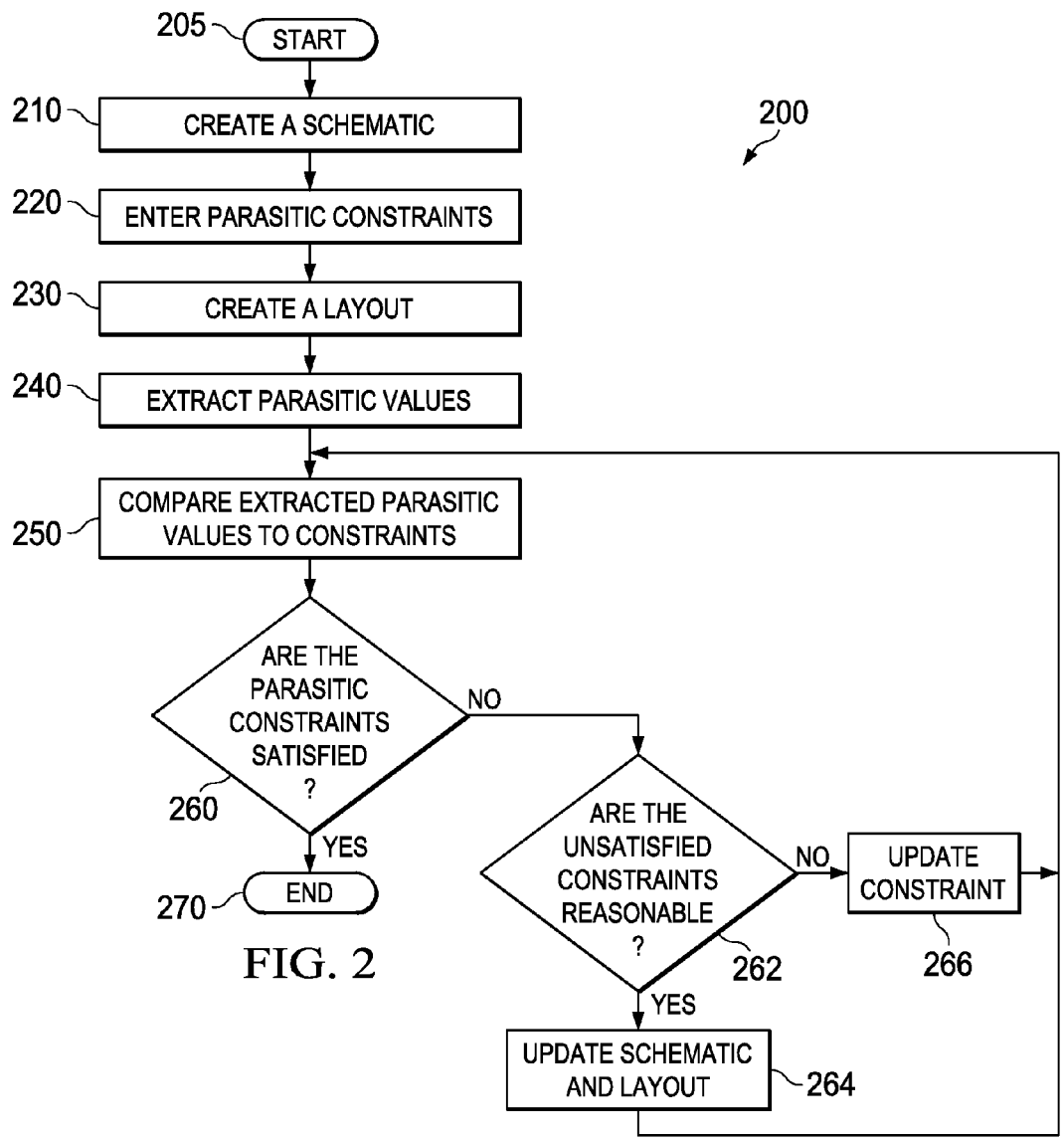
FIG. 2 is a flow diagram of an embodiment of a method of designing an analog integrated circuit carried out according to the principals of the present disclosure.

FIG. 2 illustrates a flow diagram of an embodiment of a method 200 of designing an integrated circuit carried out according to the principals of the present disclosure. The method 200 may be implemented as a series of algorithms that direct the operation of computer readable medium. The method 200 begins in a step 205 with intent to design an analog IC.

The method 200 proceeds to a step 210 where a schematic is created for the analog IC. The schematic may be generated by an IC design tool. For example, the schematic may be generated using Virtuoso® Schematics from Cadence. The schematic is generated based on a set of specifications for the analog IC including parasitic values. The schematic is simulated to verify compliance with the specifications. A SPICE tool, such as Spectre from Cadence, may be used to simulate the schematic diagram. The parasitic values may be increased before simulation to ensure compliance during later stages of the design process.

After the schematic is designed, parasitic constraints are attached to the schematic in a step 220. The parasitic constraints can be added to the schematic by manual entry by a user. Additionally, the parasitic constraints may be attached to the schematic by being associated with a cellview that is selected for the schematic.

After the parasitic constraints are attached to the schematic, a layout is created for the integrated circuit based on the schematic in a step 230. The layout may be created using Virtuoso® Layout from Cadence. The layout provides a physical representation of the analog IC.

The parasitic values are then extracted from the layout in a step 240. A conventional probing device, such as Assura® RCX may be used to extract the parasitic values from the layout. The extracted parasitic values may be arranged in a table. After extraction of the parasitic values, the extracted parasitic values are compared to the parasitic constraints in a step 250. A constraint confirmer of a parasitic constraint analyzer may be used to perform the comparison.

In a first decisional step 260, a determination is made if the parasitic constraints are satisfied. The determination may be based on the comparison of the parasitic constraints to corresponding parasitic values extracted from the layout. If each parasitic constraint is satisfied, the method 200 ends in a step 270. If a constraint or constraints are not satisfied, then a determination is made in a second decisional step 262 if those unsatisfied constraints are reasonable. If the unsatisfied constraints are reasonable, the method continues to a step 264 where the schematic and layout are updated to bring these diagrams within compliance of the unsatisfied constraints. After updating the schematic and the layout, the method 200 then continues to step 250.

Returning now to the second decisional step 262, if an unsatisfied constraint is not reasonable, then the constraint is updated in a step 266. The parasitic constraint may be updated by a user entering data on an input form. Alternatively, the parasitic constraint may be updated automatically. The method 200 then proceeds to step 250 and continues as described above.

The disclosure provides an apparatus and method for entering and verifying parasitic constraints without back-annotating extracted parasitic values for re-simulation. The parasitic constraints can be used to both constrain the total parasitic value on a node and the parasitic value between two nodes at the same time. The disclosure can interface with existing IC design tools to specify parasitic constraints on a cellview, check for violation of these constraints and display information on the parasitic values of the cellview.

The above-described apparatus and methods may be embodied in or performed by various conventional digital data processors or computers, wherein the computers are programmed or store executable programs of sequences of software instructions to perform one or more of the steps of the methods or functions of the apparatus. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods or the functions of the apparatus.

Those skilled in the art to which the disclosure relates will appreciate that other and further additions, deletions, substitutions and modifications may be made to the described embodiments without departing from the scope of the disclosure.

What is claimed is:

1. A method of designing an analog integrated circuit, comprising:
   creating a schematic of an analog integrated circuit based on a set of specifications;
   attaching parasitic constraints to said schematic, the parasitic constraints comprising at least one limit of resistance, capacitance, or inductance applicable to circuit nodes in the schematic, and corresponding to the set of specifications;
   creating a layout of said analog integrated circuit based on said schematic including said parasitic constraints;
   extracting parasitic values from parasitic elements of said layout; and
   operating a computer to compare said extracted parasitic values with said parasitic constraints to verify compliance therewith.

2. The method as recited in claim 1 further comprising identifying said parasitic constraints that are not satisfied.

3. The method as recited in claim 2 further comprising determining if said unsatisfied constraints are reasonable.

4. The method as recited in claim 3 further comprising adjusting said unsatisfied constraints that are determined to be unreasonable.

5. The method as recited in claim 2 further comprising identifying said parasitic values of said layout that do not comply with said parasitic constraints.

6. The method as recited in claim 5 wherein said parasitic values include at least one individual parasitic value and a total parasitic value associated with a single one of said parasitic elements.

7. The method as recited in claim 5 further comprising operating the computer to display an extracted view of said layout indicating a location of a parasitic element having a parasitic value that does not comply with at least one of said parasitic constraints associated with the parasitic values.

8. For use in the design of analog integrated circuits, a parasitic constraint analyzer implemented in a computing device, comprising:
   a constraint manager configured to associate parasitic constraints comprising at least one limit of resistance, capacitance, or inductance, and based on a set of specifications of an analog integrated circuit, to components of a schematic of the analog integrated circuit; and
   a constraint confirmer coupled to said constraint manager and configured to compare parasitic values extracted from a layout of said schematic with said parasitic constraints to determine whether said layout complies therewith.

9. The parasitic constraint analyzer as recited in claim 8 further comprising a constraint editor coupled to said constraint confirmer and configured to adjust said parasitic constraints.

10. The parasitic constraint analyzer as recited in claim 9 wherein said constraint editor is further configured to determine whether at least one of said parasitic constraints is unreasonable and to adjust said unreasonable parasitic constraint.

11. The parasitic constraint analyzer as recited in claim 8 wherein said constraint manager receives said parasitic constraints from a set of specifications used to generate said schematic.

12. The parasitic constraint analyzer as recited in claim 9 wherein said constraint confirmer is configured to determine compliance of said layout with said parasitic constraints without back-annotation of said parasitic values.

13. The parasitic constraint analyzer as recited in claim 12 wherein said constraint confirmer is configured to determine compliance of said layout with said parasitic constraints without simulating said schematic with extracted parasitic values from said layout.

14. The parasitic constraint analyzer as recited in claim 8 wherein said parasitic constraints include both a constraint on a total parasitic value for a node of said schematic and a parasitic value between said node and another node of said schematic.

15. A method of operating a computer to determine whether a layout of an analog integrated circuit complies with parasitic constraints, comprising:

receiving parasitic constraints comprising at least one limit of resistance, capacitance, or inductance, and based on a set of specifications for an analog integrated circuit, at the computer;

attaching said parasitic constraints to a schematic of said analog integrated circuit;

operating the computer to compare parasitic values extracted from a layout of said schematic with said parasitic constraints to verify compliance therewith; and determining whether one of said parasitic constraints is unreasonable.

16. The method as recited in claim 15 wherein said parasitic constraints are received from a user via manual input.

17. The method as recited in claim 15 further comprising adjusting said one of said parasitic constraints determined to be unreasonable.

18. The method as recited in claim 17 wherein said adjusting is based on input received from a user.

19. The method as recited in claim 15 further comprising displaying an extracted view of said layout indicating a location of a parasitic element having a parasitic value that does not comply with at least one of said parasitic constraints.

20. The method as recited in claim 15 wherein said parasitic constraints are selected from the group consisting of: a capacitance constraint, a resistance constraint, an RC time constant constraint, and a capacitive matching constraint.

21. The method as recited in claim 15 wherein at least one of said parasitic constraints is a global parasitic constraint.

\* \* \* \* \*